United States Patent [19]

Goodrich

[11] Patent Number: 4,785,379
[45] Date of Patent: Nov. 15, 1988

[54] PRINTED CIRCUIT MODULE RETAINER

[75] Inventor: Melville A. Goodrich, Brookline, Mass.

[73] Assignee: GTE Government Systems Corporation, Waltham, Mass.

[21] Appl. No.: 128,838

[22] Filed: Dec. 4, 1987

[51] Int. Cl.[4] .............................................. H05K 7/20
[52] U.S. Cl. .................................... 361/388; 165/185; 361/383
[58] Field of Search ............................. 165/80.3, 185; 174/16 HS; 211/41; 361/383-384, 386-389, 413, 415; 439/377, 485

[56] References Cited

U.S. PATENT DOCUMENTS 3,926,305 12/1975 Wallestad ............................. 211/41
4,096,547 6/1978 Calabro ................................ 361/388

FOREIGN PATENT DOCUMENTS 2145290 3/1985 United Kingdom ................ 361/389
2164803 3/1986 United Kingdom ................ 361/415

Primary Examiner—A. D. Pellinen
Assistant Examiner—Gregory D. Thompson
Attorney, Agent, or Firm—J. Stephen Yeo

[57] ABSTRACT

A printed circuit module retainer has two linear guides which are channeled to accept edges of printed circuit module. A serpentine spring transverses each channel to retain an inserted module.

4 Claims, 2 Drawing Sheets

U.S. Patent    Nov. 15, 1988    Sheet 1 of 2    4,785,379
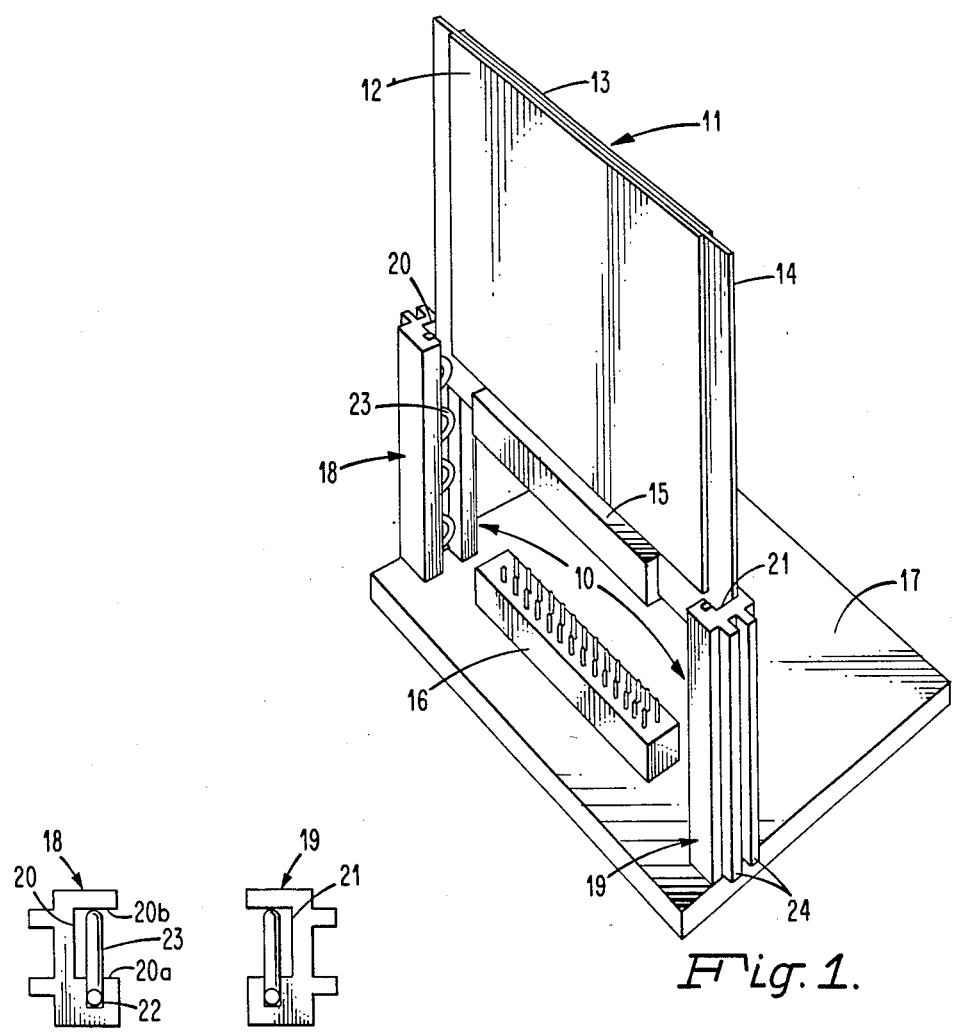
Fig. 1.
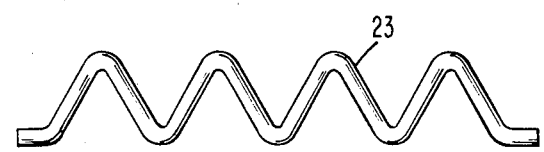
Fig. 2.
Fig. 3.

PRINTED CIRCUIT MODULE RETAINER

BACKGROUND OF THE INVENTION

This invention pertains to hardware for retaining electronic components, and more particularly is concerned with retaining devices for printed circuit modules.

Electronic components are often mounted on a printed circuit module, which in turn is slid into a frame to couple with a mating connector. The module is held in place by screws, rivets, or latches. Such arrangements, while reliable and widely accepted, require more labor for the insertion and removal of modules than desired.

It is therefore an object of the invention to provide means for guiding and retaining printed circuit modules without screws, rivets, latches, or other hardware requiring manipulation.

SUMMARY OF THE INVENTION

According to one aspect of the invention, a printed circuit module retainer has two linear guides which are channeled to accept edges of printed circuit module. A serpentine spring transverses each channel to retain an inserted module.

BRIEF DESCRIPTION OF THE DRAWINGS

FIG. 1 is a view of a printed circuit module retainer embodying the invention;

FIG. 2 is an end view of a guide member used in the retainer;

FIG. 3 is a view of a serpentine spring used in the retainer; and

DETAILED DESCRIPTION OF THE INVENTION

Figure 4:
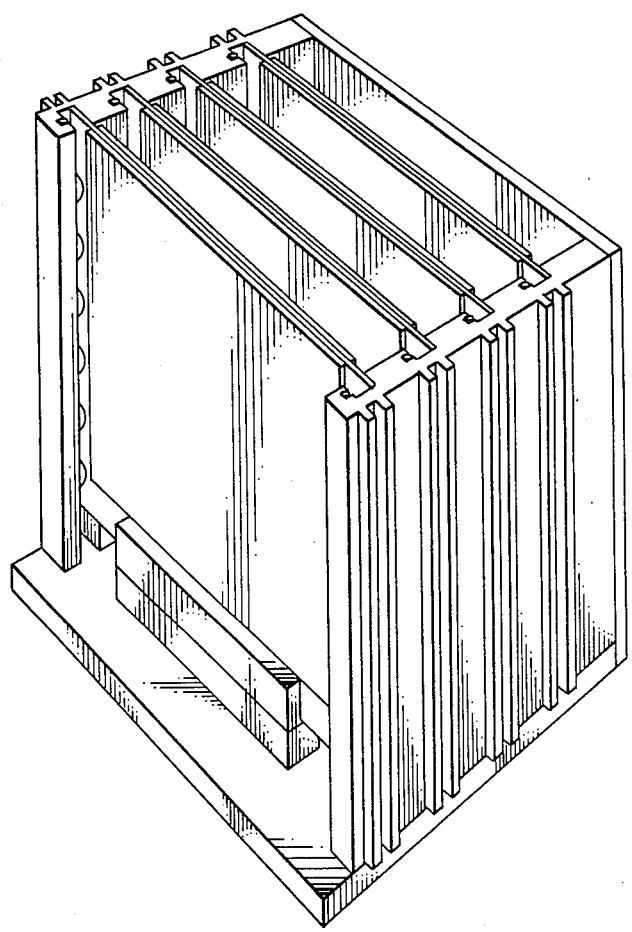
FIG. 4 is a view of two cold walls, which define a plurality of guide members.

Referring first to FIG. 1, there is seen a printed circuit module retainer 10 embodying the invention. A printed circuit module 11 is shown partially inserted into retainer 10. The printed circuit module 11 typically has printed circuit boards 12, and 13 mounted on both sides of an aluminum or copper clad invar plate named a spine 14. Spine 14 extends beyond the sides of printed circuit boards 12, and 13 and provides the side edges of module 11. One end of module 11 has a connector 15 which is to couple with a matching connector 16 on support structure 17, which may be a mother circuit board.

Retainer 10 has two elongated guides 18, and 19. Each guide 18, and 19 has an elongated channel 20, and 21 which guides the module during insertion. The guides 18, and 19 may be mounted on support structure 17, or on a housing (not shown) in a parallel spaced relationship, with channels 20 and 21 facing each other to accept edges of module 11.

Referring to FIG. 2, there is seen an end view of guides 18, and 19. Channel 20 of guide 18 has two parallel walls, identified as first channel wall 20a and second channel wall 20b. First channel wall 20a has an elongated groove 22. Groove 22 holds a serpentine spring 23, which pushes against opposed second channel wall 20b. Heat radiating fins 24 may extend from a surface of the guide. Guide 19 is the mirror image of guide 18 and also holds a spring. Guides 18 and 19 may be machined or extruded from aluminum or other heat conductive material.

Spring 23 is seen separately in FIG. 3. Spring 23 is elongated and serpentine in shape. It may be made of heat treated 0.047 inch diameter type 316 cres wire.

Returning to FIG. 1, it is seen that as the edges of module 11 are inserted into the channels 20, and 21, the springs urge the edges of module 11 against the second channel walls, thus retaining the module in position notwithstanding vibration and shock, while promoting and enhancing heat dissipation from module 11 to the guides.

As seen in FIG. 4, a plurality of guides may be fabricated in one piece of material to form what is known in the art as a cold wall. Two opposing cold walls allow a plurality of modules to be retained.

The preferred embodiment and best mode of the invention has been described. Modifications will now be apparent to those skiled in the art. Therefore, the scope of the invention is to be determined by the following claims.

I claim:

1. A printed circuit module retainer comprising:
   two elongated guides, each guide having an elongated channel with a first channel wall, and a second channel wall parallel to said first channel wall, each first channel wall having an elongated groove;
   said guides adapted to be mounted in parallel spaced relationship for accepting edges of a printed circuit module; and
   an elongated serpentine spring corresponding to each channel, each spring retained by the corresponding groove against the second channel wall of its corresponding channel, for urging an edge of an inserted printed circuit module against the second channel wall of the corresponding channel.

2. The retainer of claim 1 wherein each of said guides has fins for radiating heat extending from at least one side of each guide.

3. A retainer for a plurality of printed circuit modules comprising:
   two cold walls, each cold wall defined as an elongated guide, each guide having a plurality of elongated channels, each channel having a first channel wall, and a second channel wall parallel to said first channel wall, each first channel wall having an elongated groove;
   said cold walls adapted to be mounted in parallel spaced relationship for accepting edges of a plurality of printed circuit modules; and
   an elongated serpentine spring corresponding to each groove, each spring retained by the corresponding groove against the second channel wall of its corresponding channel, for urging an edge of an inserted printed circuit module against the second channel wall of the corresponding channel.

4. The retained of claim 3 wherein each cold wall carries a plurality of fins for radiating heat.

* * * * *